United States Patent
Goldie et al.

(10) Patent No.: US 11,216,609 B2
(45) Date of Patent: Jan. 4, 2022

(54) GENERATING INTEGRATED CIRCUIT PLACEMENTS USING NEURAL NETWORKS

(71) Applicant: Google LLC, Mountain View, CA (US)

(72) Inventors: Anna Darling Goldie, Mountain View, CA (US); Azalia Mirhoseini, San Jose, CA (US); Ebrahim Songhori, San Jose, CA (US); Wenjie Jiang, Mountain View, CA (US); Shen Wang, Sunnyvale, CA (US); Roger David Carpenter, San Francisco, CA (US); Young-Joon Lee, San Jose, CA (US); Mustafa Nazim Yazgan, Cupertino, CA (US); Chian-Min Richard Ho, Palo Alto, CA (US); Quoc V. Le, Sunnyvale, CA (US); James Laudon, Madison, WI (US); Jeffrey Adgate Dean, Palo Alto, CA (US); Kavya Srinivasa Setty, Sunnyvale, CA (US); Omkar Pathak, Mountain View, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 17/238,128

(22) Filed: Apr. 22, 2021

(65) Prior Publication Data

US 2021/0334445 A1 Oct. 28, 2021

Related U.S. Application Data

(60) Provisional application No. 63/014,021, filed on Apr. 22, 2020.

(51) Int. Cl.
*G06F 30/392* (2020.01)
*G06N 3/08* (2006.01)
*G06F 30/398* (2020.01)

(52) U.S. Cl.
CPC .......... *G06F 30/392* (2020.01); *G06F 30/398* (2020.01); *G06N 3/08* (2013.01)

(58) Field of Classification Search
CPC ...... G06F 30/39; G06F 30/392; G06F 30/398; G06F 30/30; G06F 30/27; G06F 30/323; G06F 30/327; G06N 3/08
(Continued)

(56) References Cited

U.S. PATENT DOCUMENTS 6,301,693 B1  10/2001  Naylor et al.
8,589,855 B1 * 11/2013  Ward ................... G06F 30/398
                                                    716/136
(Continued)

OTHER PUBLICATIONS

U.S. Appl. No. 16/703,837, filed Dec. 4, 2019, Ho et al.
(Continued)

*Primary Examiner* — Paul Dinh
(74) *Attorney, Agent, or Firm* — Fish & Richardson P.C.

(57) ABSTRACT

Methods, systems, and apparatus, including computer programs encoded on computer storage media, for generating a computer chip placement. One of the methods includes obtaining netlist data for a computer chip; and generating a computer chip placement, comprising placing a respective macro node at each time step in a sequence comprising a plurality of time steps, the placing comprising, for each time step: generating an input representation for the time step; processing the input representation using a node placement neural network having a plurality of network parameters, wherein the node placement neural network is configured to process the input representation in accordance with current values of the network parameters to generate a score distribution over a plurality of positions on the surface of the computer chip; and assigning the macro node to be placed at the time step to a position from the plurality of positions using the score distribution.

27 Claims, 4 Drawing Sheets

(58) Field of Classification Search
USPC .......................................................... 716/100
See application file for complete search history.

(56) References Cited

U.S. PATENT DOCUMENTS

| | | | |
|---|---|---|---|
| 10,699,043 B2 | 6/2020 | Ho et al. | |
| 2015/0286766 A1* | 10/2015 | Singh ................... | G06F 30/392 716/121 |

OTHER PUBLICATIONS

Addanki et al, "Placeto: Learning generalizable device placement algorithms for distributed machine learning" arXiv, 2019, 15 pages.
Agnihotri et al, "Recursive bisection placement: Feng shui 5.0 implementation details" Proceedings of the International Symposium on Physical Design, 2005, 3 pages.
Hu et al, "Multilevel fixed-point-addition-based vlsi placement" IEEE Transactions on Computer-Aided Design of Integrated Circuits and Systems 2005, 16 pages.
Brenner et al, "Bonnplace: Placement of leading-edge chips by advanced combinatorial algorithms" Trans. Cimp.-Aided Des. Integ. Cir. Sys., 2008, 14 pages.
Breuer, "A class of min-cut placement algorithms" Proceedings of the 14th Design Automation Conference 1977, 7 pages.
Chen et al, "Ntu-place3: An analytical placer for large-scale mixed-size designs with preplaced blocks and density constraints" IEEE Transactions on Computer-Aided Design of Integrated Circuits and Systems 2008, 13 pages.
Chen et al, "A high-quality mixed-size analytical placer considering preplaced blocks and density constraints" Proceedings of the 2006 IEEE, 2006, 6 pages.
Cheng et al, "RePlAce: Advancing solution quality and routability validation in global placement" IEEE Transactions on Computer-Aided Design of Integrated Circuits and Systems, 2019, 14 pages.
Cheng et al, "Module placement based on resistive network optimization" IEEE Transactions on Computer-Aided Design of Integrated Circuits and Systems 1984, 13 pages.
Fiduccia et al, "A linear-time heuristic for improving network partitions" 19th Design Automation Conference, 1982, 7 pages.
Gilbert et al, "Steiner minimal trees" SIAM Journal Applied Mathematics, 1968, 29 pages.
Hsu et al, "TSV-aware analytical placement for 3D IC designs" 48th ACM Design Automation Conference, 2011, 6 pages.
Huang et al, "Routability-driven macro placement with embedded cnn-based prediction model" Design, Automation & Test in Europe Conference & Exhibition, 2019, 6 pages.
Kahng et al, "Architecture and details of a high quality, large-scale analytical placer" IEEE, 2005, 8 pages.
Karypis et al, "A hypergraph partioning package" HMETIS, 1998, 20 pages.
Kernighan, "A procedure for placement of standard-cell VLSI circuits" IEEE, 1985, 7 pages.
Kim et al, "Complx: A competitive primal-dual lagrange optimization for global placement" DAC, 2012, 9 pages.
Kim et al, "Simpl: An effective placement algorithm" Proceedings of the International Conference on Computer-Aided Design, 2010, 10 pages.
Kim et al, "Maple: Multilevel adaptive placement for mixed-size designs" Proceedings of the 2012 ACM International Symposium on International Symposium on Physical Design, 2012, 8 pages.
Kirkpatrick et al, "Optimization by simulated annealing" Science, 1983, 10 pages.
Lin et al, "Polar: Placement based on novel rough legalization and refinement" Proceedings of the International Conference on Computer-Aided Design, 2013, 6 pages.
Lin et al, "Dreamplace: Deep learning toolkit-enabled gpu acceleration for modem vlsi placement" Proceedings of the 56th Annual Design Automation Conference, 2019, 6 pages.
Lu et al, "Eplace: Electrostatics-based placement using fast fourier transform and neterovs method" ACM Trans. Dec. Autom. Electron. Syst., 2015, 33 pages.
Nazi et al, "GAP: Generalizable approximate graph partitioning framework" ICLR, 2019, 7 pages.
Obermeier et al, "Kraftwerk: a versatile placement approach" ACM, 2005, 3 pages.
Paliwal et al, "Regal: Transfer learning for fast optimization of computation graph" arXiv, 2020, 24 pages.
Ren-Song et al, Proud: a sea-of-gates placement algorithm, IEEE, 1988, 13 pages.
Schulman et al, "Proximal policy optimization algorithms" arXiv, 2017, 12 pages.
Sechen et al, "Timber-Wolf3.2: a new standard cell placement and global routing package" IEEE Computer Society Press, 1986, 13 pages.
Shahookar et al, "VLSI cell placement techniques" ACM Comput. Surv., 1991, 78 pages.
Spinder et al, "Kraftwerk2a fast force-directed quadratic placement approach using an accurate net model" IEEE, 2008, 14 pages.
Luo et al., "Dplace2.0: A stable and efficient analytical placement based on diffusion" IEEE, 2008, 6 pages.
Viswanathan et al, "PQL: Global placement via relaxed quadratic spreading and linearization" Proceedings, 2007, 6 pages.
Zhang et al, "Link prediction based on graph neural networks" NIPS, 2018, 11 pages.
Zhiyao et al, "Routenet: Routability prediction for mixed-size designs using convolutional neural network" ACM, 2018, 8 pages.
Zhou et al, "GDP: Generalized device placement for dataflow graphs" arXiv, 2019, 11 pages.
Aykanat et al., "A fast neural-network algorithm for VLSI cell placement" Neural Networks, 1998, 14 pages.
Chang et al., "VLSI Circuit Placement with Rectilinear Modules using Three-Layer Force-Directed Self-Organizing Maps" IEEE, 1997, 16 pages.
Goldie et al., "Placement Optimization with Deep Reinforcement Learning" Proceedings of the 2020 International Symposium on Physical Design, 2020, 5 pages.
Mirhoseini et al., "Chip Placement with Deep Reinforcement Learning" arXiv, Apr. 2020, 15 pages.
PCT International Search Report and Written Opinion in International Application No. PCT/US2021/028713, dated Aug. 19, 2021, 19 pages.
Zhang et al., "Mapping and hierarchical self-organizing neural networks for VLSI placement" IEEE, 1997, 16 pages.

* cited by examiner

GENERATING INTEGRATED CIRCUIT PLACEMENTS USING NEURAL NETWORKS

CROSS-REFERENCE TO RELATED APPLICATION

This application claims priority to U.S. Patent Application No. 63/014,021, filed Apr. 22, 2020, the entire contents which are incorporated by reference.

BACKGROUND

This specification relates to using neural networks for electronic design automation and, more specifically, for generating a computer chip placement.

Computer chip placements are schematic representations of the placement of some or all of the circuits of a computer chip on the surface, i.e., the chip area, of the computer chip.

Neural networks are machine learning models that employ one or more layers of nonlinear units to predict an output for a received input. Some neural networks include one or more hidden layers in addition to an output layer. The output of each hidden layer is used as input to the next layer in the network, i.e., the next hidden layer or the output layer. Each layer of the network generates an output from received inputs in accordance with current values of a respective set of parameters.

SUMMARY

This specification describes a system implemented as computer programs on one or more computers in one or more locations that generates a chip placement for an integrated circuit. The integrated circuit for which the chip placement is being generated will be referred to in this specification as a "computer chip" but should generally be understood to mean any collection of electronic circuits that are fabricated on one piece of semiconductor material. The chip placement places each node from a netlist of nodes at a respective location on the surface of the computer chip.

Particular embodiments of the subject matter described in this specification can be implemented so as to realize one or more of the following advantages.

Floorplanning, which involves placing the components of a chip on the surface of the chip, is a crucial step in the chip design process. The placement of the components should optimize metrics such as area, total wire length and congestion. If a floorplan does not perform well on these metrics, the integrated circuit chip that is generated based on the floor plan will perform poorly. For example, the integrated circuit chip could fail to function, could consume an excessive amount of power, could have an unacceptable latency, or have any of a variety of other undesirable properties that are caused by sub-optimal placement of components on the chip.

The described techniques allow for a high-quality chip floorplan to be generated automatically and with minimal user involvement by making use of the described node placement neural network and the described training techniques. As a particular example, when distributed training is employed, a high-quality (i.e., a superhuman) placement can be generated in on the order of hours without any human-expert involvement.

Unlike the described systems, conventional floorplanning solutions employ weeks long processes that require heavy human involvement. Because of the enormous space of potential node placement combinations, conventional automated approaches have been unable to reliably generate high-quality floorplans without consuming an excessive amount of computational power and wall clock time, requiring human expert involvement, or both. By effectively making use of reinforcement learning to train the described node placement neural network, however, the described techniques are able to quickly generate a high-quality floorplan.

Furthermore, an integrated circuit chip which is produced using the method may have reduced power consumption compared to one produced by a conventional method. It may also have increased computing power for a given surface area, or from another point view be produced using fewer resources for a given amount of computing power.

Additionally, the described node placement neural network, when trained as described in this specification, i.e., when the encoder neural network is trained through supervised learning and the policy neural network is trained through reinforcement learning, can generalize quickly to new netlists and new integrated circuit chip dimensions. This greatly reduces the amount of computational resources that are required to generate placements for new netlists, because little to no computationally expensive fine-tuning is required to generate a high-quality floorplan for a new netlist.

The details of one or more embodiments of the subject matter described in this specification are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

Figure 1:
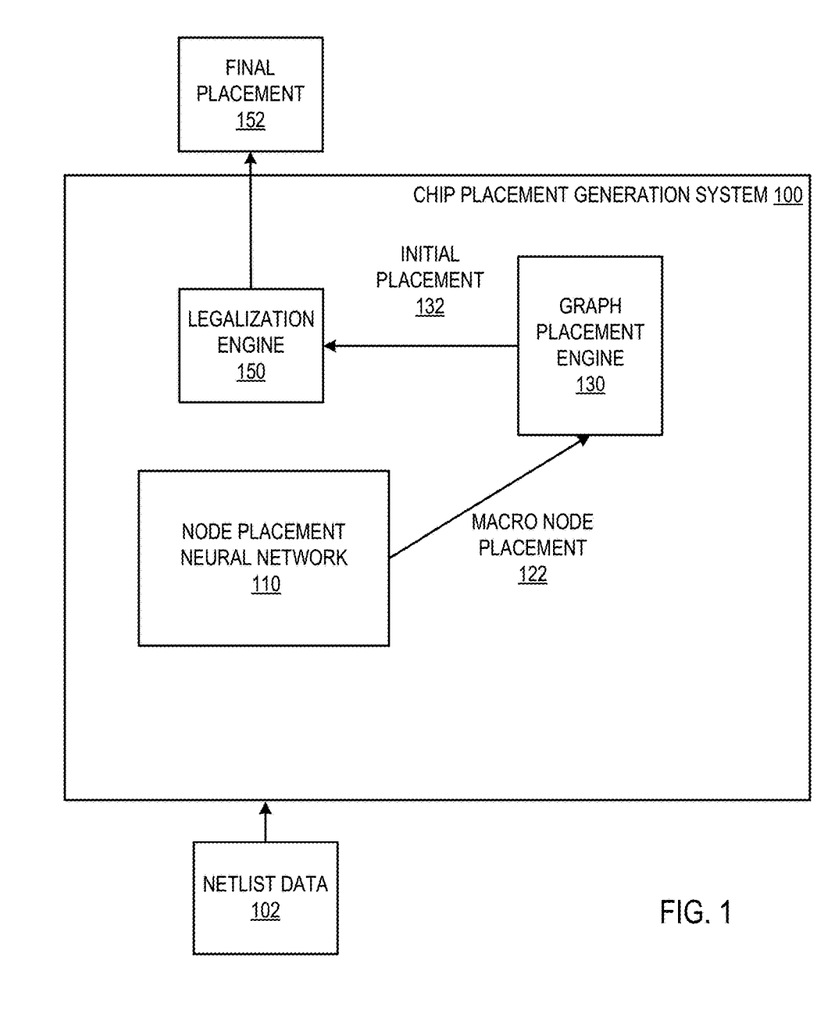
FIG. 1 shows an example placement generation system.

FIG. 1 shows an example placement generation system 100. The placement generation system 100 is an example of a system implemented as computer programs on one or more computers in one or more locations in which the systems, components, and techniques described below are implemented.

The system 100 receives netlist data 102 for a computer chip, i.e., a very large-scale integration (VLSI) chip, that is to be manufactured and that includes a plurality of integrated circuit components, e.g., transistors, resistors, capacitors, and so on. The plurality of integrated circuit components may be different depending on the desired function of the chip. For example, the chip can be a special-purpose chip, i.e., an application-specific integrated circuit (ASIC), for machine learning computations, video processing, cryptography, or another compute-intensive function.

The netlist data 102 is data describing the connectivity of the integrated circuit components of the computer chip. In particular, the netlist data 102 specifies a connectivity on the computer chip among a plurality of nodes that each correspond to one or more of a plurality of integrated circuit components of the computer chip. That is, each node corresponds to a respective proper subset of the integrated circuit components, and those subsets do not overlap. In other words, the netlist data 102 identifies, for each of the plurality of nodes, which other nodes (if any) the node needs to be connected to by one or more wires in the manufactured computer chip. In some cases, the integrated circuit components have already been clustered in clusters, e.g., by an external system or by using an existing clustering technique, and each node in the netlist data represents a different one of the clusters.

The system 100 generates, as output, a final computer chip placement 152 that places some or all of the nodes in the netlist data 102 at a respective position on the surface of the computer chip. That is, the final computer chip placement 152 identifies a respective position on the surface of the computer chip for some or all of the nodes in the netlist data 102 and, therefore, for the integrated circuit components that are represented by the node.

As one example, the netlist data 102 can identify two types of nodes: nodes that represent macro components and nodes that represent standard cell components.

Macro components are large blocks of IC components, e.g., static random-access memory (SRAM) or other memory blocks, that are represented as a single node in the netlist. For example, the nodes representing macro components can include nodes that each represent a corresponding instance of an SRAM. As another example, the nodes representing macro components can include hard macros that are made up of a fixed number of standard cells, e.g., a macro that is made up of a fixed number of instances of a register file. As another example, the nodes representing macro components can include one or more nodes that each represent a phase-locked loop (PLL) circuit to be placed on the chip. As yet another example, the nodes representing macro components can include one or more nodes that each represent a sensor to be placed on the chip.

Standard cell components are a group of transistor and interconnect structures, e.g., a group that provides a boolean logic function (e.g., AND, OR, XOR, XNOR, inverters) or a group that provides a storage function (e.g., flipflop or latch).

In some implementations, nodes in the netlist data represent a single standard cell component. In some other implementations, nodes in the netlist data represent already clustered standard cell components.

Generally, the placement 152 assigns each node to a grid square in an N×M grid overlaid over the surface of the chip, where N and M are integers.

In some implementations, the values of N and M are provided as inputs to the system 100.

In other implementations, the system 100 generates the values of N and M.

For example, the system 100 can treat choosing the optimal number of rows and columns as a bin-packing problem and rank different combinations of rows and columns by the amount of wasted space they incur on the surface of the chip. The system 100 can then select the combination that results in the least amount of wasted space as the values for N and M.

As another example, the system 100 can process an input derived from the netlist data, data characterizing the surface of the integrated circuit chip, or both using a grid generation machine learning model that is configured to process the input to generate an output that defines how to divide the surface of the integrated circuit chip into the N×M grid.

The system 100 includes a node placement neural network 110 and a graph placement engine 130.

The system 100 uses the node placement neural network 110 to generate a macro node placement 122.

In particular, the macro node placement 122 places each macro node, i.e., each node representing a macro, in the netlist data 102 at a respective position on the surface of the computer chip.

The system 100 generates the macro node placement 122 by placing a respective macro node from the netlist data 102 at each time step in a sequence of a plurality of time steps.

That is, the system 100 generates the macro node placement node-by-node over a number of time steps, with each macro node being placed at a location at a different one of the time steps, according to a macro node order. The macro node order orders the macro nodes, with each node that is before any given macro node in the macro node order being placed before the given macro node.

At each particular time step in the sequence, the system 100 generates an input representation for the particular time step and processes the input representation using the node placement neural network 110.

The input representation for a particular time step generally characterizes at least (i) respective positions on the surface of the chip of any macro nodes that are before a particular macro node to be placed at the particular time step in the macro node order and (ii) the particular macro node to be placed at the particular time step.

The input representation can also optionally include data that characterizes the connectivity between the nodes that is specified in the netlist data 102. For example, the input representation may characterize for, some or all of the nodes, one or more other of the nodes to which that node is connected according to the netlist. For example, the input representation can represent each connection between any two nodes as an edge connecting the two nodes.

An example input representation is described in more detail below with reference to FIG. 2.

In the first time step of the sequence, the input representation indicates that no nodes have been placed and therefore indicates, for each node in the netlist, that the node does not yet have a position on the surface of the chip.

The node placement neural network 110 is a neural network that has parameters (referred to in this specification as "network parameters") and that is configured to process the input representation in accordance with current values of the network parameters to generate a score distribution, e.g., a probability distribution or a distribution of logits, over a plurality of positions on the surface of the computer chip. For example, the distribution can be over the grid squares in the N×M grid overlaid over the surface of the chip.

The system 100 then assigns the macro node to be placed at the particular time step to a position from the plurality of positions using the score distribution generated by the neural network.

The operations performed by the neural network 110 at a given time step and placing a node at the time step using the score distribution are described in more detail below with reference to FIGS. 2-4.

By adding macro nodes to the placement one by one, after the last time step in the sequence, the macro node placement will include a respective placement for all of the macro nodes in the netlist data 102.

Once the system 100 has generated the macro node placement 122, the graph placement engine 130 generates an initial computer chip placement 132 by placing each of the standard cells at a respective position on the surface of a partially placed integrated circuit chip that includes the macro components represented by the macro nodes placed according to the macro node placement, i.e., placed as in the macro node placement 122.

In some implementations, the engine 130 clusters the standard cells into a set of standard cell clusters (or obtains data identifying already generated clusters) and then places each cluster of standard cells at a respective position on the surface of the partially placed integrated circuit chip using a graph placement technique. As a particular example, the engine 130 can cluster the standard cells using a partitioning technique that is based on the normalized minimum cut objective. An example of such a technique is hMETIS, which is described in Karypis, G. and Kumar, V. A hypergraph partitioning package. In HMETIS, 1998.

In some other implementations, the engine 130 does not cluster the standard cells and directly places each standard cell at a respective position on the surface of the partially placed integrated circuit chip using the graph placement technique. The graph placement technique can be any appropriate technique for placing nodes of a graph. For example, the engine 130 can use a force based technique, i.e., a force-directed technique. In particular, when using a force based technique, the engine 130 represents the netlist as a system of springs that apply force to each node, according to the weight×distance formula, causing tightly connected nodes to be attracted to one another. Optionally, the engine 130 also introduces a repulsive force between overlapping nodes to reduce placement density. After applying all forces, the engine 130 moves nodes in the direction of the force vector. To reduce oscillations, the engine 130 can set a maximum distance for each move. Using force-directed techniques to place nodes is described in more detail in Shahookar, K. and Mazumder, P. Vlsi cell placement techniques. ACM Comput. Surv., 23(2):143220, June 1991. ISSN 0360-0300. doi: 10.1145/103724.103725.

In some implementations, the system 100 uses the initial placement 132 as the final placement 152.

In some other implementations, the system 100 provides the initial placement 132 as input to a legalization engine 150 that adjusts the initial placement 132 to generate the final placement 152.

In particular, the legalization engine 150 can generate a legalized integrated circuit chip placement by applying a greedy legalization algorithm to the initial integrated circuit chip placement. For example, the engine 150 can perform a greedy legalization step to snap macros onto the nearest legal position while honoring the minimum spacing constraints.

Optionally, the engine 150 can further refine the legalized placement or can refine the initial placement 132 directly without generating the legalized placement, e.g., by performing simulated annealing on a reward function. An example reward function will be described in more detail below. As a particular example, the engine 150 can perform simulated annealing by applying a hill climbing algorithm to iteratively adjust the placements in the legalized placement or the initial placement 132 to generate the final computer chip placement 152. Hill climbing algorithms and other simulated annealing techniques that can be used to adjust the macro node placement 122 are described in more detail in S. Kirkpatrick, C. D. Gelatt, and M. P. Vecchi. Optimization by simulated annealing. SCIENCE, 220(4598):671-680, 1983. As another example, the system 100 further refine the legalized placement or can refine the initial placement 132 directly without generating the legalized placement by providing the legalized placement or the initial placement 132 to an electronic design automation (EDA) software tool for evaluation and fine-tuning.

Optionally, the system 100 or an external system can then fabricate (produce) a chip (integrated circuit) according to the final placement 152. Such an integrated circuit may exhibit improved performance, e.g., have one or more of lower power consumption, lower latency, or smaller surface area, than one designed using a conventional design process, and/or be producible using fewer resources. The fabrication may use any known technique. In some cases, fabricating the chip according to the final placement can include presenting data identifying the placement to a user to allow the user to modify the final placement 152 before fabrication or providing the final placement 152 to an electronic design automation (EDA) for fine-tuning before fabrication.

The system 100 can receive the netlist data 102 in any of a variety of ways.

For example, the system 100 can receive the netlist data 102 as an upload from a remote user of the system over a data communication network, e.g., using an application programming interface (API) made available by the system 100. In some cases, the system 100 can then provide the final placement 152 to the remote user through the API provided by the system 100, e.g., for use in fabricating a chip according to the final placement 152.

As another example, the system 100 can be part of an electronic design automation (EDA) software tool and can receive the netlist data 102 from a user of the tool or from another component of the tool. In this example, the system 100 can provide the final placement 152 for evaluation by another component of the EDA software tool before the computer chip is fabricated.

Figure 2:
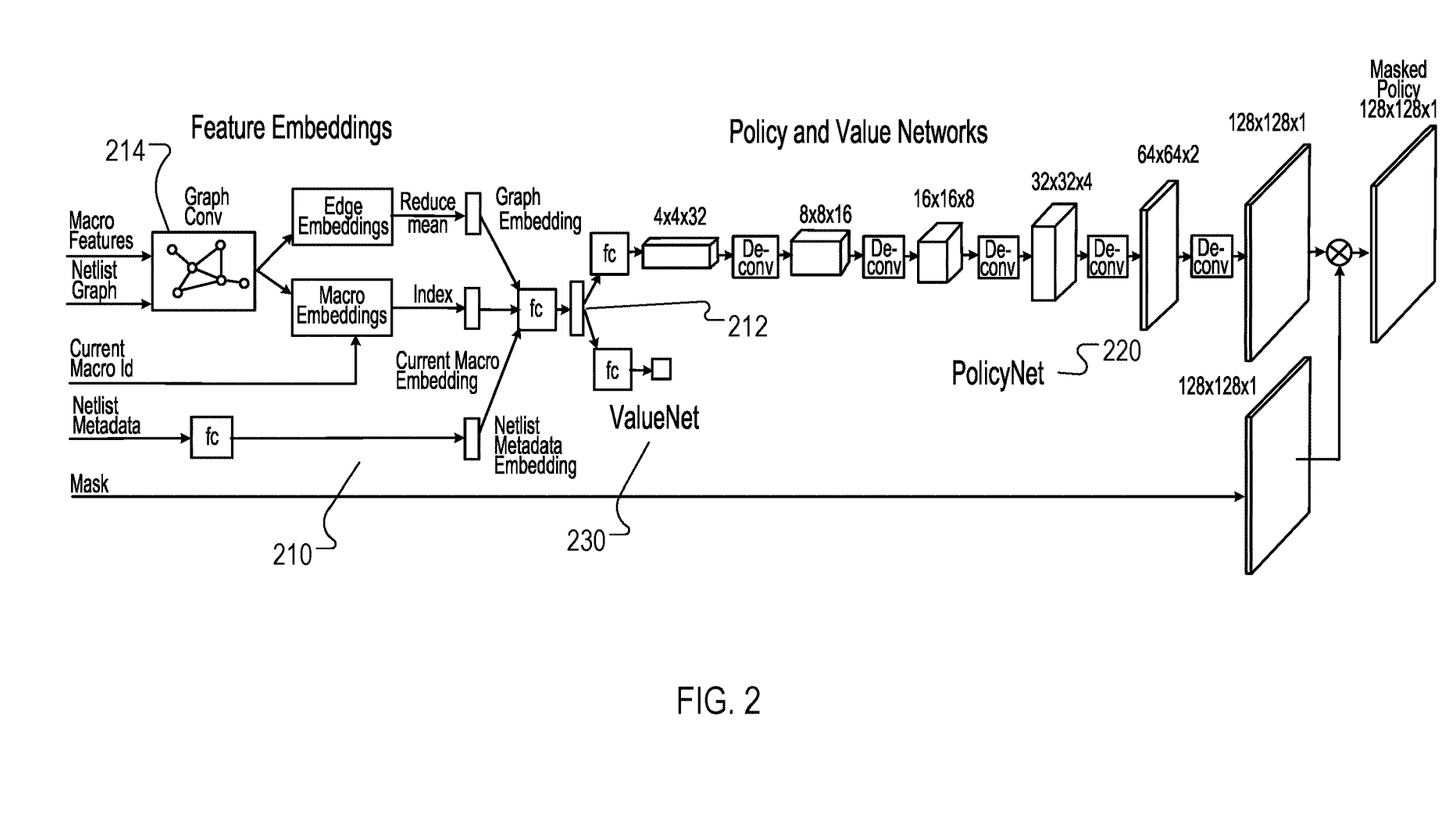
FIG. 2 illustrates the processing of the node placement neural network at a time step.

FIG. 2 shows the processing of the node placement neural network 110 at a given time step.

As described above with reference to FIG. 1, at each time step during generation of a placement, the node placement neural network 110 is configured to receive an input representation and to process the input representation to generate a score distribution, e.g., a probability distribution or a distribution of logits, over a plurality of locations on the surface of the computer chip.

Generally, the input representation includes least (i) data characterizing respective positions on the surface of the chip of any macro nodes that are before a particular macro node to be placed at the particular time step in the macro node order and (ii) data characterizing the particular macro node to be placed at the particular time step.

As shown in FIG. 2, the node placement neural network 110 includes an encoder neural network 210, a policy neural network 220, and, optionally, a value neural network 230.

The encoder neural network 210 is configured to, at each particular time step, process the input representation to generate an encoded representation 212 of the input representation. An encoded representation is a numeric representation in a fixed dimensional space, i.e., an ordered collection of a fixed number of numeric values. For example, the encoded representation can be a vector or a matrix of floating point values or other type of numeric values.

The policy neural network 220 is configured to, at each particular time step, process the encoded representation 212 to generate the score distribution.

Generally, the policy neural network 220 can have any appropriate architecture that allows the policy neural network 220 to map the encoded representation 212 to a score distribution. As shown in the example of FIG. 2, the policy neural network 220 is a deconvolutional neural network that includes a fully-connected neural network followed by a set of de-convolutional layers. The policy neural network 220 can optionally include other types of neural network layers, e.g., batch normalization layers or other kinds of normalization layers. In other examples, however, the policy neural network 220 can be, e.g., a recurrent neural network, i.e., a neural network that includes one or more recurrent neural network layers, e.g., long short-term memory (LSTM) layers, gated recurrent unit (GRU) layers, or other types of recurrent layers, with an output layer that generates the scores for the positions. For example, when the scores are probabilities, the output layer can be a softmax layer.

The value neural network 230, when used, is configured to, at each particular time step, process the encoded representation 212 to generate a value estimate that estimates a value of a current state of the placement as of the particular time step. The value of the current state is an estimate of the output of a reward function for a placement that is generated starting from the current state, i.e., starting from the current, partial placement. For example, the value neural network 230 can be a recurrent neural network or can be a feedforward neural network, e.g., one that includes one or more fully-connected layers.

This value estimate can be used during the training of the neural network 110, i.e., when using a reinforcement learning technique that relies on value estimates being available. In other words, when the reinforcement learning technique used to train the node placement neural network requires a value estimate, the node placement neural network 110 also includes the value neural network 230 that generates the value estimates that are required by the reinforcement learning technique.

Training the node placement neural network 110 will be described in more detail below.

As shown in the example of FIG. 2, the input feature representation includes a respective vectorized representation of some or all of the nodes in the netlist ("macro features"), "netlist graph data" that represents the connectivity between nodes in the netlist as edges that each connect two respective nodes in the netlist data, and a "current macro id" that identifies the macro node that is being placed at the particular time step. As a particular example, the input feature representation can include a respective vectorized representation of only the macro nodes, of the macro nodes and the clusters of standard cells, or of the macro nodes and the standard cell nodes.

Each vectorized representation characterizes the corresponding node. In particular, for each node that has already been placed, the vectorized representation includes data identifying the position of the node on the surface of the chip, e.g., the coordinates of the center of the node or of some other designated part of the node, and for each node that has not already been placed, the vectorized representation includes data indicating that the node has not yet been placed, e.g., includes default coordinates that indicate that the node has yet to be placed on the surface of the chip. The vectorized representation can also include other information that characterizes the node, e.g., the type of the node, the dimensions of the node, e.g., the height and width of the node, and so on.

In the example of FIG. 2, the encoder neural network 210 includes a graph encoder neural network 214 that processes the vectorized representations of the nodes in the netlist to generate (i) a netlist embedding of the vectorized representations of the nodes in the netlist and (ii) a current node embedding that represents the macro node to be placed at the particular time step. An embedding is a numeric representation in a fixed dimensional space, i.e., an ordered collection of a fixed number of numeric values. For example, the embedding can be a vector or a matrix of floating point values or other type of numeric values.

In particular, the graph encoder neural network 214 initializes a respective edge embedding for each edge in the netlist data, e.g., randomly, and initializes a respective node embedding for each node in the netlist data, i.e., so that the node embedding is equal to the respective vectorized representation for the node.

The graph encoder neural network 214 then repeatedly updates the node and edge embeddings by updating the embeddings at each of a plurality of message passing iterations.

After the last message passing iteration, the graph encoder neural network 214 generates the netlist embedding and the current node embedding from the node and edge embeddings.

As a particular example, the neural network 214 can generate the netlist embedding by combining the edge embeddings after the last message passing iteration. For example, the system can compute the netlist embedding by applying a reduce mean function on the edge embeddings after the last message passing iteration.

As another particular example, the neural network 214 can set the current node embedding for the current node to be equal to the embedding for the current node after the last message passing iteration.

The neural network 214 can use any of a variety of message passing techniques to update the node and edge embeddings at each message passing iteration.

As a particular example, at each message passing iteration, the neural network 214 updates the edge embedding for each edge using the respective node embeddings for the two nodes connected by the edge.

At each iteration, to update the embedding for a given edge, the network 214 generates an aggregated representation from at least the node embeddings for the two nodes connected by the edge and processes the aggregated representation using a first fully-connected neural network to generate the updated edge embedding for the given edge. In some implementations, each edge has the same weight, i.e., one, in the netlist data. In some other implementations, each edge is associated with a respective weight in the netlist data, and the system generates the aggregated representation from the node embeddings for the two nodes connected by the edge and the weight associated with the edge in the netlist data. The weights for each edge can be, e.g., learned jointly with the training of the neural network.

To update the embedding for a given node at a given message passing iteration, the system updates the node embedding for the node using the respective edge embeddings for the edges that are connected to the node. For example, the system can average the respective edge embeddings for the edges that are connected to the node.

The input feature representation can also optionally include "netlist metadata" that characterizes the netlist of nodes. The netlist metadata can include any appropriate information that characterizes the netlist. For example, the information could include any of information about the underlying semiconductor technology (horizontal and vertical routing capacity), the total number of nets (edges), macros, and standard cell clusters in the netlist, canvas size, i.e., size of the surface of the chip, or the number of rows and columns in the grid.

When the input feature representation includes netlist metadata, the encoder neural network 210 can include a fully-connected neural network that processes the metadata to generate a netlist metadata embedding.

The encoder neural network 210 generates the encoded representation from at least the netlist embedding of the vectorized representations of the nodes in the netlist and the current node embedding that represents the macro node to be placed at the particular time step. When the encoder neural network 210 also generates a netlist metadata embedding, the system also uses the netlist metadata embedding to generate the encoded representation.

As a particular example, the neural network 210 can concatenate the netlist embedding, the current node embedding, and the netlist metadata embedding and then process the concatenation using a fully-connected neural network to generate the encoded representation.

The system also tracks the density of the positions on the chip, i.e., of the squares in the grid. In particular, the system maintains a density value for each position that indicates the degree to which that position is occupied. When a node has been placed at a given position, the density value for that position is set equal to one (or to a different maximum value that indicates that the position is fully occupied). When no node has been placed at the given position, the density value for that position indicates the number of edges that pass through the position. The density value for a given position can also reflect blockages, e.g., clock straps or other structures that block certain parts of the chip surface, by setting the values for those positions to one.

Once the policy neural network 220 has generated the score distribution at the time step, the system uses the density to generate a modified score distribution and then assigns the node corresponding to the time step using the modified score distribution. In particular, the system modifies the score distribution by setting the score for any position that has a density value that satisfies, e.g., exceeds, a threshold to zero.

For example, the system can assign the node to the position having the highest score in the modified score distribution or sample a position from the modified score distribution, i.e., so that each position has a likelihood of being selected that is equal to the likelihood, and then assign the node to the sampled position.

This is represented in FIG. 2 as a grid density mask which can be applied to the score distribution, i.e., as a mask in which the value for any position that has a density that is above the threshold value is zero and the value for any position that has a density that is not above the threshold value is one, to generate the modified score distribution.

As a particular example, the threshold can be equal to one and the system can set the score for any position at which a node has already been placed, i.e., that has a density value of one, to zero. As another example, the threshold can be less than one, indicating that the system also sets the score to zero for any position that does not have a node but that has too many wires running through it (i.e., the number of wires associated with a position is above a threshold).

In order for the neural network 110 to be used to generate high quality placements, the system (or another system) trains the neural network on training data.

In some implementations, the system trains the neural network 110 end-to-end using reinforcement learning to maximize the expected rewards received as measured by a reward function. The reward function generally measures the quality of the placements generated using the node placement neural network 110. The reward function will be described in more detail below with reference to FIG. 3.

However, training the neural network only through reinforcement learning may result in poor generalization to new netlist data and the system may therefore have to re-train the neural network, e.g., from scratch, each time a new netlist is received.

To improve the generalization of the neural network 110, the system can train the encoder neural network 210 through supervised learning and then train the policy neural network 220 through reinforcement learning. Such a training process is described in more detail below with reference to FIG. 3.

Figure 3:
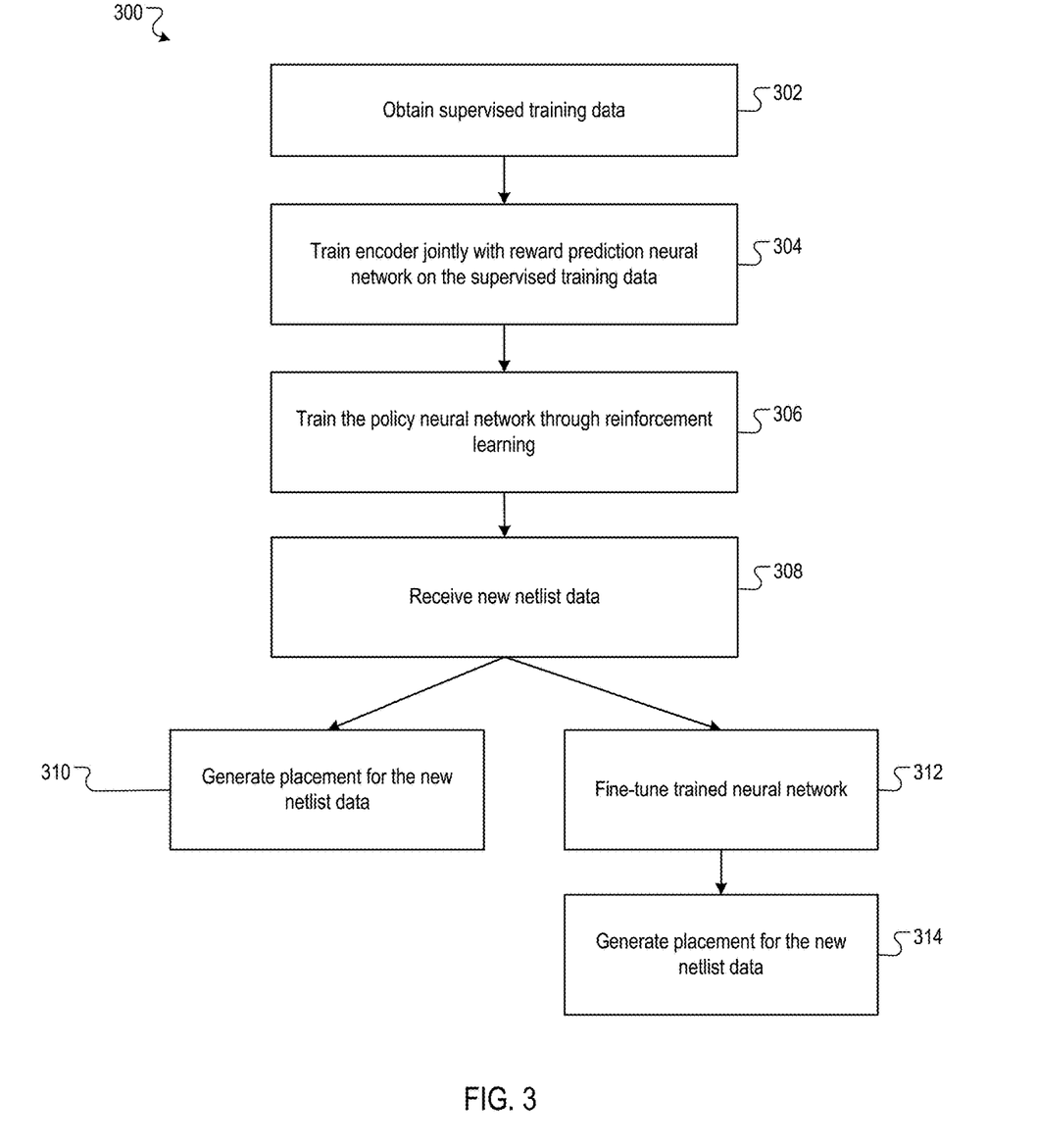
FIG. 3 is a flow diagram of an example process for training the node placement neural network.

FIG. 3 is a flow diagram of an example process 300 for training a node placement neural network. For convenience, the process 300 will be described as being performed by a system of one or more computers located in one or more locations. For example, a placement generation system, e.g., the placement generation system 100 of FIG. 1, appropriately programmed, can perform the process 300.

The system can perform the process 300 to train the node placement neural network, i.e., to determine trained values of the network parameters.

In some implementations, the system distributes the training of the node placement neural network across many different workers, i.e., across many different homogenous or heterogeneous computing devices, i.e., devices that perform training computations using CPUs, GPUs, or ASICs. In some of these implementations, some or all of the steps 300 can be performed in parallel by many different workers operating asynchronously from one another in order to speed up the training of the node placement neural network. In other implementations, the different workers operate synchronously to perform some or all of the steps of the process 300 in parallel in order to speed up the training of the neural network.

The system can use the process 300 to train any node placement neural network that includes (i) an encoder neural network that is configured to, at each of a plurality of time steps, receive an input representation that includes data representing a current state of a placement of a netlist of nodes on a surface of an integrated circuit chip as of the time step and process the input representation to generate an encoder output, and (ii) a policy neural network configured to, at each of the plurality of time steps, receive an encoded representation generated from the encoder output generated by the encoder neural network and process the encoded representation to generate a score distribution over a plurality of positions on the surface of the integrated circuit chip.

One example of such a neural network is the one described above with reference to FIG. 2.

Another example of such a neural network is described in application Ser. No. 16/703,837, filed Dec. 4, 2019, entitled GENERATING INTEGRATED CIRCUIT FLOORPLANS USING NEURAL NETWORKS, the entire contents of which are hereby incorporated herein in their entirety.

The system obtains supervised training data (step 302).

The supervised training data includes (i) a plurality of training input representations, each training input representation representing a respective placement of a respective netlist of nodes, and (ii) for each training input representation, a respective target value of a reward function that measures a quality of the placement of the respective netlist of nodes.

More specifically, the reward function measures certain characteristics of the generated placements that, when optimized, result in a chip that is manufactured using the generated placement exhibiting good performance, e.g., in terms of one or more of power consumption, heat generation, or timing performance.

In particular, the reward function incudes a respective term for one or more characteristics. For example, when there are multiple terms, the reward function can be a sum or a weighted sum of the multiple terms.

As one example, the reward function can include a wire length measure, i.e., a term that measures wire length of the wires on the surface of the chip, that is higher when the wire length between nodes on the surface of the chip is shorter.

For example, the wire length can be the negative of the Manhattan distance or other distance measure between all of the adjacent nodes on the surface of the chip.

As another example, the wire length measure can be based on half-perimeter wirelength (HPWL), which approximates the wire length using the half-perimeter of the bounding boxes for all nodes in the netlist. When computing the HPWL, the system can assume that all wires leaving a standard cell cluster originate at the center of the cluster. In particular, the system can compute the HPWL for each edge in the netlist and then compute the wire length measure as equal to the negative of a normalized sum of the HPWLs for all of the edges in the netlist.

Including a term that measures the wire length in the reward function has the advantage that write length roughly measures wiring cost and also correlates with other important metrics, such as power and timing.

As another example, the reward function can include a congestion measure, i.e., a term that measures congestion, that is higher when congestion on the surface of the computer chip is lower. Congestion is a measure of the difference between available wiring resources in a given region (not necessarily a contiguous region) on the chip versus the actual wires that run through the region. For example, the congestion may be defined as the ratio of the wires that run through the region in the generated placement to the available wiring resources (e.g., a maximum number of wires which can run though that region). As a particular example, the congestion measure can track the density of wires across the horizontal and vertical edges of the surface.

In particular, the system can make use of a routing model for the netlist (e.g., net bounding box, upper L, lower L, A*, minimum spanning tree, or actual routed net, and so on). Based on this routing model, the congestion measure can be calculated by determining the ratio of, for each position on the surface, the available wiring resources in the placement versus wiring estimates from the routing model for the position.

As another example, the system can compute the congestion measure by keeping track of vertical and horizontal allocations at each position separately, e.g., computed as described above. The system can then smooth the congestion estimate by running convolutional filters, e.g., 5×1 convolutional filters or differently sized filters depending on the number of positions in each direction, in both the vertical and horizontal direction. The system can then compute the congestion measure as the negative of the average of the top 10%, 15%, or 20% of the congestion estimates.

As another example, the reward function can include a timing term, i.e., a term that measures timing of the digital logic, that is higher when the performance of the chip is better (e.g., the reward function takes a correspondingly a higher value for placements of respective chips which take less time to perform a certain computational task). Timing or performance of a placement can be measured using static timing analysis (STA). This measurement can include calculating stage delays over logic paths (including internal cell delays and wire delays) and finding critical paths that would determine the maximum speed the clock can run for safe operation. For a realistic view of timing, logic optimization may be necessary to accommodate paths getting longer or shorter as node placements are in progress.

As another example, the reward function can include one or more terms that measure the power or energy that would be consumed by the chip, i.e., one or more terms that are higher when the power that would be consumed by the chip is lower.

As another example, the reward function can include one or more terms that measure the area of the placement, i.e., that are higher when the area taken up by the placement is lower.

In some cases, the system receives the supervised training data from another system.

In other cases, the system generates the supervised training data. As a particular example, the placements represented by the plurality of training input representations can be generated based on outputs of a different node placement neural network, e.g., a node placement neural network that has a simpler architecture than the one described above with reference to FIG. 2, at different time points during the training of the different node placement neural network on different netlists. This can ensure that the placements are of varying quality.

For example, the system can generate the supervised training data by selecting a set of different accelerator netlists and then generating placements for each netlist. To generate diverse placements for each netlist, the system can train a simpler policy network at various congestion weights (ranging from 0 to 1) and random seeds on the netlist data, e.g., through reinforcement learning, and collect snapshots of each placement during the course of policy training. Each snapshot includes a representation of the placement and the reward value generated by the reward function for the placement. An untrained policy network starts off with random weights and the generated placements are of low quality, but as the policy network trains, the quality of generated placements improves, allowing the system to collect a diverse dataset with placements of varying quality.

In some implementations, the training input representations can all represent finalized placements, i.e., ones with all of the macro nodes in the corresponding netlist placed. In some other implementations, the training input representations can represent placements at various stages of placement generation process, i.e., some representations can represent partial placements with only some of the macro nodes placed.

The system trains the encoder neural network jointly with a reward prediction neural network on the supervised training data through supervised learning (step 304).

The reward prediction neural network is configured to, for each training encoder input, receive the encoder output generated by the encoder neural network from the training input representation and process the encoded representation to generate a predicted value of the reward function for the placement represented by the training input representation.

The reward prediction neural network can be, e.g., a fully-connected neural network that receives the encoder output and processes the encoder output to generate the reward prediction. When the encoder neural network has the architecture described above with reference to FIG. 2, the encoder output can be a concatenation of the netlist graph embedding and the metadata embedding.

For example, the system can train the encoder neural network and the reward prediction neural network to optimize an objective function, e.g., a mean squared error loss, that measures, for a given training representation, an error between the target value of the reward function and the predicted value of the reward function for the training input representation.

The system then trains the policy neural network through reinforcement learning to generate score distributions that result in placements that maximize the reward function. (step 306). The system can use any of a variety of reinforcement learning techniques to train the node placement neural network.

For example, the system can use a policy gradient technique, e.g., REINFORCE or Proximal Policy Optimization (PPO), for the training. In these cases, when the neural network includes the value prediction neural network, the value prediction generated by the value neural network can be used to compute the baseline value that modifies the reward function value when computing the gradient of the reinforcement learning loss function.

While training the policy neural network through reinforcement learning, the system can hold the values of parameters of the encoder neural network fixed to the values determined through the training on the supervised training data.

In particular, while training the policy neural network through reinforcement learning on a given netlist for a given chip, the system can use the placement neural network to place the macro nodes in the given netlist one-by-one as described above. After the macro nodes have been placed, the system can place the standard cell nodes as described above to determine a final placement. The system can then compute the reward function for the final placement, e.g., by computing the required quantities described above, and use the reward value, the macro node placements, and the score distributions generated by the placement neural network to train the placement neural network through reinforcement learning. Thus, while the placement neural network is only used to place the macro nodes, the reward values are computed only after the standard cell nodes have also been placed, ensuring that the placement neural network generates macro node placements that still allow for high quality placements of standard cell nodes.

The system receives new netlist data (step 308).

In some implementations, the system generates an integrated circuit placement for the new netlist data using the trained node placement neural network, i.e., by placing a respective node from the new netlist data at each of a plurality of time steps using score distributions generated by the trained node placement neural network (step 310). That is, the system generates the placement for the new netlist data without training the node placement neural network any further.

That is, by training the encoder neural network through supervised learning and then training the policy neural network through reinforcement learning, the system trains the node placement neural network to generalize to new netlists without any additional training.

In some other implementations, to further improve the quality of the placement that is generated for the new netlist, the system first fine-tunes the trained node placement neural network on the new netlist data through reinforcement learning (step 312) and then generates an integrated circuit placement for the new netlist data using the fine-tuned node placement neural network (step 314) as described above. The system can use the same reinforcement learning technique described above during the fine-tuning and, depending on the implementation, can either hold the parameter values of the encoder neural network fixed or update the parameter values of the encoder neural network during this fine-tuning.

Figure 4:
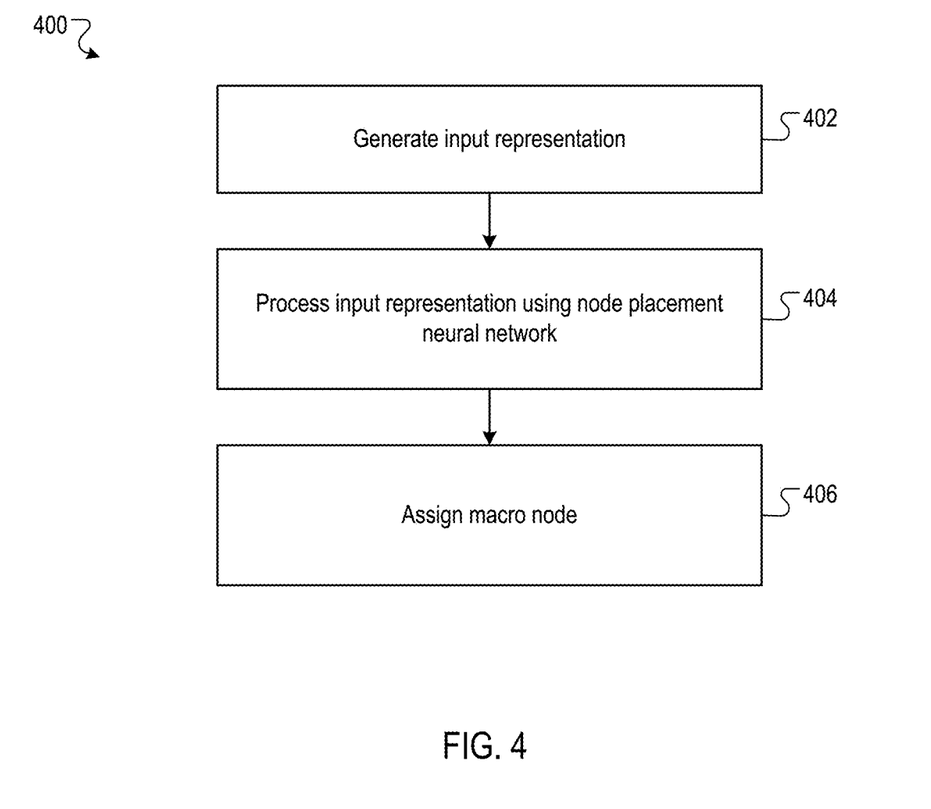
FIG. 4 is a flow diagram of an example process for placing a macro node at a given time step.

FIG. 4 is a flow diagram of an example process 400 for placing a macro node at a given time step. For convenience, the process 400 will be described as being performed by a system of one or more computers located in one or more locations. For example, a placement generation system, e.g., the placement generation system 100 of FIG. 1, appropriately programmed, can perform the process 400.

The system can perform the process 400 for each time step in the sequence of time steps to place each macro node according to the macro node order.

In some implementations, the system receives the macro node order as an input along with the netlist data.

In some other implementations, the system can generate the macro node order from the netlist data.

As one example, the system can order the macro nodes according to size, e.g., by descending size, and break ties using a topological sort. By placing larger macros first, the system reduces the chance of there being no feasible placement for a later macro. The topological sort can help the policy network learn to place connected nodes close to one another.

As another example, the system can process an input derived from the netlist data through a macro node order prediction machine learning model that is configured to process the input derived from the netlist data to generate an output that defines the macro node order.

As yet another example, the node placement neural network can be further configured to generate a probability distribution over the macro nodes. Then, the system can generate the macro node order dynamically by, for each particular time step in the plurality of time steps, selecting the macro node to be placed at the next time step after the particular time step based on the probability distribution over the macro nodes. For example, the system can select the macro node that has yet to be placed that has the highest probability.

The system generates, from the netlist data, an input representation that characterizes at least (i) respective positions on the surface of the chip of any macro nodes that are before a particular macro node to be placed at the given time step in the macro node order and (ii) the particular macro node to be placed at the given time step (step 402). Optionally, the input representation can also include other information about the nodes in the netlist, netlist metadata, or both. An example of the input representation is described above with reference to FIG. 2.

The system processes the input representation using a node placement neural network having a plurality of parameters ("network parameters") (step 404). The node placement neural network is configured to process the input representation in accordance with current values of the network parameters to generate a score distribution over a plurality of positions on the surface of the integrated circuit chip.

The system assigns the macro node to be placed at the particular time step to a position from the plurality of positions using the score distribution (step 406). As described above, the system can modify the score distribution based on the tracked density of the current placement, i.e., by setting the scores for any positions that have a density value that satisfies a threshold value to zero, and then select a position from the modified score distribution.

In some implementations, the system can further modify the score distribution using additional information.

In particular, as described above, in some implementations the neural network is trained on multiple different placements for multiple different netlists for multiple different chips. This can require the neural network to generate score distributions over differently sized chip surfaces. That is, when the plurality of positions are grid squares from an N×M grid overlaid over the surface of the integrated circuit chip, different chips can have different values for N and M. To account for this, the system can configure the neural network to generate scores over a fixed size maxN×maxM grid. When the value of N for the current chip is less than maxN, the system can set to zero the scores for the extra rows. Similarly, when the value of M for the current chip is less than maxM, the system can set to zero the scores for the extra columns.

This specification uses the term "configured" in connection with systems and computer program components. For a system of one or more computers to be configured to perform particular operations or actions means that the system has installed on it software, firmware, hardware, or a combination of them that in operation cause the system to perform the operations or actions. For one or more computer programs to be configured to perform particular operations or actions means that the one or more programs include instructions that, when executed by data processing apparatus, cause the apparatus to perform the operations or actions.

Embodiments of the subject matter and the functional operations described in this specification can be implemented in digital electronic circuitry, in tangibly-embodied computer software or firmware, in computer hardware, including the structures disclosed in this specification and their structural equivalents, or in combinations of one or more of them. Embodiments of the subject matter described in this specification can be implemented as one or more computer programs, i.e., one or more modules of computer program instructions encoded on a tangible non transitory storage medium for execution by, or to control the operation of, data processing apparatus. The computer storage medium can be a machine-readable storage device, a machine-readable storage substrate, a random or serial access memory device, or a combination of one or more of them. Alternatively or in addition, the program instructions can be encoded on an artificially generated propagated signal, e.g., a machine-generated electrical, optical, or electromagnetic signal, that is generated to encode information for transmission to suitable receiver apparatus for execution by a data processing apparatus.

The term "data processing apparatus" refers to data processing hardware and encompasses all kinds of apparatus, devices, and machines for processing data, including by way of example a programmable processor, a computer, or multiple processors or computers. The apparatus can also be, or further include, special purpose logic circuitry, e.g., an FPGA (field programmable gate array) or an ASIC (application specific integrated circuit). The apparatus can optionally include, in addition to hardware, code that creates an execution environment for computer programs, e.g., code that constitutes processor firmware, a protocol stack, a database management system, an operating system, or a combination of one or more of them.

A computer program, which may also be referred to or described as a program, software, a software application, an app, a module, a software module, a script, or code, can be written in any form of programming language, including compiled or interpreted languages, or declarative or procedural languages; and it can be deployed in any form, including as a stand alone program or as a module, component, subroutine, or other unit suitable for use in a computing environment. A program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub programs, or portions of code. A computer program can be deployed to be executed on one computer or on multiple computers that are located at one site or distributed across multiple sites and interconnected by a data communication network.

In this specification, the term "database" is used broadly to refer to any collection of data: the data does not need to be structured in any particular way, or structured at all, and it can be stored on storage devices in one or more locations. Thus, for example, the index database can include multiple collections of data, each of which may be organized and accessed differently.

Similarly, in this specification the term "engine" is used broadly to refer to a software-based system, subsystem, or process that is programmed to perform one or more specific functions. Generally, an engine will be implemented as one or more software modules or components, installed on one or more computers in one or more locations. In some cases, one or more computers will be dedicated to a particular engine; in other cases, multiple engines can be installed and running on the same computer or computers.

The processes and logic flows described in this specification can be performed by one or more programmable computers executing one or more computer programs to perform functions by operating on input data and generating output. The processes and logic flows can also be performed by special purpose logic circuitry, e.g., an FPGA or an ASIC, or by a combination of special purpose logic circuitry and one or more programmed computers.

Computers suitable for the execution of a computer program can be based on general or special purpose microprocessors or both, or any other kind of central processing unit. Generally, a central processing unit will receive instructions and data from a read only memory or a random access memory or both. The elements of a computer are a central processing unit for performing or executing instructions and one or more memory devices for storing instructions and data. The central processing unit and the memory can be supplemented by, or incorporated in, special purpose logic circuitry. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device, e.g., a universal serial bus (USB) flash drive, to name just a few.

Computer readable media suitable for storing computer program instructions and data include all forms of non volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks.

To provide for interaction with a user, embodiments of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's device in response to requests received from the web browser. Also, a computer can interact with a user by sending text messages or other forms of message to a personal device, e.g., a smartphone that is running a messaging application, and receiving responsive messages from the user in return.

Data processing apparatus for implementing machine learning models can also include, for example, special-purpose hardware accelerator units for processing common and compute-intensive parts of machine learning training or production, i.e., inference, workloads.

Machine learning models can be implemented and deployed using a machine learning framework, e.g., a TensorFlow framework, a Microsoft Cognitive Toolkit framework, an Apache Singa framework, or an Apache MXNet framework.

Embodiments of the subject matter described in this specification can be implemented in a computing system that includes a back end component, e.g., as a data server, or that includes a middleware component, e.g., an application server, or that includes a front end component, e.g., a client computer having a graphical user interface, a web browser, or an app through which a user can interact with an implementation of the subject matter described in this specification, or any combination of one or more such back end, middleware, or front end components. The components of the system can be interconnected by any form or medium of digital data communication, e.g., a communication network. Examples of communication networks include a local area network (LAN) and a wide area network (WAN), e.g., the Internet.

The computing system can include clients and servers. A client and server are generally remote from each other and typically interact through a communication network. The relationship of client and server arises by virtue of computer programs running on the respective computers and having a client-server relationship to each other. In some embodiments, a server transmits data, e.g., an HTML page, to a user device, e.g., for purposes of displaying data to and receiving user input from a user interacting with the device, which acts as a client. Data generated at the user device, e.g., a result of the user interaction, can be received at the server from the device.

While this specification contains many specific implementation details, these should not be construed as limitations on the scope of any invention or on the scope of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially be claimed as such, one or more features from a claimed combination can in some cases be excised from the combination, and the claimed combination may be directed to a subcombination or variation of a subcombination.

Similarly, while operations are depicted in the drawings and recited in the claims in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

What is claimed is:

1. A method performed by one or more computers, the method comprising:
    obtaining netlist data for an integrated circuit chip, wherein the netlist data specifies a connectivity on the integrated circuit chip between a plurality of nodes that each correspond to one or more of a plurality of integrated circuit components of the integrated circuit chip, and wherein the plurality of nodes comprise macro nodes representing macro components and standard cell nodes representing standard cell components; and
    generating an integrated circuit chip placement that places each node in the netlist data at a respective position on the surface of the integrated circuit chip, comprising:
    placing a respective macro node at each of a plurality of time steps according to a macro node order to generate a macro node placement of the macro nodes on the surface of the chip, the placing comprising, for each particular time step in the plurality of time steps:
        generating, from the netlist data, an input representation that characterizes at least (i) respective positions on the surface of the chip of any macro nodes that are before a particular macro node to be placed at the particular time step in the macro node order and (ii) the particular macro node to be placed at the particular time step;
        processing the input representation using a node placement neural network having a plurality of network parameters, wherein the node placement neural network is configured to process the input representation in accordance with current values of the network parameters to generate a score distribution over a plurality of positions on the surface of the integrated circuit chip; and assigning the macro node to be placed at the particular time step to a position from the plurality of positions using the score distribution; and generating an initial integrated circuit chip placement, comprising placing each of the standard cells at a respective position on the surface of a partially placed integrated circuit chip that includes the macro components represented by the macro nodes placed according to the macro node placement.

2. The method of claim 1, wherein placing each of the standard cells comprises:

clustering the standard cells to generate a plurality of clusters of standard cells; and placing each cluster of standard cells at a respective position on the surface of the partially placed integrated circuit chip using a graph placement technique.

3. The method of claim 1, wherein placing each of the standard cells comprises:

placing each of the standard cells at a respective position on the surface of the partially placed integrated circuit chip using a graph placement technique.

4. The method of claim 2 wherein the graph placement technique is a force based technique.

5. The method of claim 1, further comprising:
generating the macro node order.

6. The method of claim 5, wherein generating the macro node order comprises processing an input derived from the netlist data through a macro node order prediction machine learning model that is configured to process the input derived from the netlist data to generate an output that defines the macro node order.

7. The method of claim 5, wherein generating the macro node order comprises:

ordering the macro components according to size.

8. The method of claim 1, wherein the plurality of positions comprise grid squares from an N×M grid overlaid over the surface of the integrated circuit chip.

9. The method of claim 8, further comprising:

processing an input derived from the netlist data, data characterizing the surface of the integrated circuit chip, or both using a grid generation machine learning model that is configured to process the input to generate an output that defines how to divide the surface of the integrated circuit chip into the N×M grid.

10. The method of claim 1, wherein:
the node placement neural network includes:
an encoder neural network that is configured to receive the input representation and process the input representation to generate an encoded representation, and a policy neural network that is configured to process the encoded representation to generate the score distribution.

11. The method of claim 10, wherein
the input feature representation comprises a respective vectorized representation of each node in the netlist, and
the encoder neural network includes a graph encoder neural network that processes the vectorized representations of the nodes in the netlist to generate (i) a netlist embedding of the vectorized representations of the nodes in the netlist and (ii) a current node embedding that represents the macro node to be placed at the particular time step.

12. The method of claim 11, wherein the netlist data represents the connectivity between nodes as edges that each connect two respective nodes in the netlist data, and wherein the graph encoder neural network is configured to:

initialize a respective edge embedding for each edge in the netlist data;

for each node in the netlist data, initialize a respective node embedding for the node in the netlist data to be equal to the respective vectorized representation for the node; and repeatedly perform the following operations:
for each edge in the netlist data, updating the edge embedding for the edge using the respective node embeddings for the two nodes connected by the edge, and for each node in the netlist data, updating the node embedding for the node using the respective edge embeddings for the edges that are connected to the node.

13. The method of claim 12, wherein updating the edge embedding for the edge comprises:

generating an aggregated representation from at least the node embeddings for the two nodes connected by the edge and processing the aggregated representation using a first fully-connected neural network to generate the updated edge embedding.

14. The method of claim 13, wherein generating the aggregated representation comprises:

processing each of the node embeddings using a second fully-connected neural network to generate respective intermediate embeddings for each of the nodes, and generating the aggregated representation by combining at least the respective intermediate embeddings.

15. The method of claim 13, wherein:
each edge is associated with a weight in the netlist data, and generating the aggregated representation comprises generating the aggregated representation from the node embeddings for the two nodes connected by the edge and the weight associated with the edge in the netlist data.

16. The method of claim 11, wherein updating the node embedding for the node using the respective edge embeddings for the edges that are connected to the node comprises:

averaging the respective edge embeddings for the edges that are connected to the node.

17. The method of claim 11, wherein the netlist embedding is a combination of the edge embeddings after repeatedly performing the operations.

18. The method of claim 11, wherein the current node embedding is the node embedding for the macro node to be placed at the particular time step after repeatedly performing the operations.

19. The method of claim 11, wherein:
for each node that has already been placed, the vectorized representation includes data identifying the position of the node on the surface of the chip, and for each node that has not already been placed, the vectorized representation includes data indicating that the node has not yet been placed.

20. The method of claim 11, wherein the encoder neural network is configured to generate the encoded representation from at least the netlist embedding of the vectorized representations of the nodes in the netlist and the current node embedding that represents the macro node to be placed at the particular time step.

21. The method of claim 10, wherein the encoder neural network has been trained through supervised learning.

22. The method of claim 10, wherein the policy neural network has been trained through reinforcement learning.

23. The method of claim 10, wherein assigning the node to a position from the plurality of positions using the score distribution comprises:
generating a modified score distribution that sets to zero the score for each position for which a density determined based on the respective positions on the surface of the chip of any macro nodes that are before the particular macro node in the macro node order exceeds a threshold value; and
assigning the node using the modified score distribution.

24. The method of claim 23, wherein assigning the node using the modified score distribution comprises:
assigning the node to the position having the highest score in the modified score distribution.

25. The method of claim 23, wherein assigning the node using the modified score distribution comprises:
sampling a position from the modified score distribution, and
assigning the node to the sampled position.

26. The method of claim 1, wherein generating the integrated circuit chip placement further comprises:
generating a legalized integrated circuit chip placement by applying a greedy legalization algorithm to the initial integrated circuit chip placement.

27. The method of claim 26, wherein generating the integrated circuit chip placement further comprises:
generating the integrated circuit chip floorplan by performing simulated annealing on a reward function starting from the legalized integrated circuit chip placement.

* * * * *